(12) United States Patent
Tao et al.

(10) Patent No.: US 7,782,692 B2
(45) Date of Patent: Aug. 24, 2010

(54) SINGLE END READ MODULE FOR REGISTER FILES

(75) Inventors: Derek Tao, Fremont, CA (US); Jay Lu, Fongyuan (TW); Annie Lum, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 277 days.

(21) Appl. No.: 11/971,901

(22) Filed: Jan. 9, 2008

(65) Prior Publication Data

US 2009/0175099 A1    Jul. 9, 2009

(51) Int. Cl.
*G11C 7/00* (2006.01)
(52) U.S. Cl. .................. 365/203; 365/189.011; 365/189.15
(58) Field of Classification Search .................. 365/203, 365/189.15, 189.011
See application file for complete search history.

(56) References Cited

U.S. PATENT DOCUMENTS 6,275,430 B1 * 8/2001 Ka .............................. 365/203

* cited by examiner

*Primary Examiner*—Son Dinh
*Assistant Examiner*—Nam Nguyen
(74) *Attorney, Agent, or Firm*—K&L Gates LLP

(57) ABSTRACT

A read module for register files includes at least one local I/O module coupled to a memory cell for outputting a value stored in the memory cell; and at least one global bit line driver having an input terminal coupled to the local I/O module, and a output terminal coupled to a global bit line for selectively pre-charging the global bit line at a default voltage in response to a local pre-charge signal, and outputting the value stored in the memory cell to the global bit line when the local pre-charge signal is not asserted.

18 Claims, 2 Drawing Sheets

SINGLE END READ MODULE FOR REGISTER FILES

BACKGROUND

The present invention relates generally to integrated circuit (IC) designs, and more particularly to a single end read module for register files.

A register file is a set of registers implemented in a central processing unit (CPU) for temporary data storage. The register file typically contains dedicated read and write ports whereas a memory device, such as random access memory (RAM), usually perform read and write functions through the same port. The register file can be accessed at a speed faster than that of the memory device, and therefore supports the CUP to function at a high speed.

FIG. 1 schematically illustrates a conventional single end read module 100 for enabling register files to be accessed from the outside for read operation. The single end read module 100 is comprised of a number of local I/O modules 102, each of which is connected to a register or memory cell. The local I/O module 102 is connected to a global bit line 106, which is further connected to an I/O pin (not shown in this figure) for data outputs, though a pull-down driver 104.

The I/O module 102 is comprised of PMOS transistors P1, P2, P3 and P4 and a NAND gate 112. PMOS transistors P1 and P2 have their sources coupled to a voltage supply VDD, and their gates controlled by a local pre-charge signal S1. The NAND gate 112 has two input terminals coupled to local bit lines 114 and 116, and an output terminal coupled to the gate of the NMOS transistor N1, which makes up the pull-down driver 104.

A latch 108 comprised of two serially connected inverters 110a and 110b is coupled to the global bit line 106 for latching a logic state of the signal thereon. A PMOS transistor P5 has a source coupled to the voltage supply VDD and a drain coupled to the global bit line 106. The gate of the PMOS transistor P5 is controlled by a global pre-charge signal S2.

In the pre-charge stage, the local pre-charge signal S1 is asserted to turn on PMOS transistors P1 and P2, thereby raising the signals on the local bit lines 114 and 116 to a high logic state. Since both input terminals of the NAND gate 112 receive high signals, the NAND gate 112 outputs a low signal, which, in turn, switches of the NMOS transistor N1. In this stage, the global pre-charge signal S2 is also asserted to turn on the PMOS transistor P5, thereby raising the signal on the global bit line 106 to a high state. The high signal on the global bit line 106 is latched by the latch 108.

In read operation, the local and global pre-charge signals S1 and S2 are disabled to allow the signals on the global bit line 106 to freely respond to the value stored in the register or memory cell (not shown in the figure) coupled to the local bit lines 114 and 116. If the voltage on either one of the bit lines 114 and 116 is low, the NAND gate 112 outputs a high signal, which, in turn, switches on the NMOS transistor N1. As the source of the NMOS transistor N1 is coupled to ground or VSS, the voltage on the global bit line 106 is pulled down, thereby causing the latch 108 to flip.

One drawback of the conventional single end read module 100 is that it is susceptible to noise-induced failure. Noise present on the global bit line 106 can cause the latch 108 to flip, thereby causing the read operation to fail. This causes reliability issues. Moreover, in a low voltage supply design, the latch 108 is even more prone to the noise-induced failure. Given the trend of low supply voltage in IC designs, failures caused by the latch 108 become a serious reliability issue.

As such, what is needed is a single end read module with improved reliability for register files.

SUMMARY

The present invention is directed to a read module for register files. In one embodiment of the present invention, the read module comprises: at least one local I/O module coupled to a memory cell for outputting a value stored in the memory cell; and at least one global bit line driver having an input terminal coupled to the local I/O module, and a output terminal coupled to a global bit line for selectively pre-charging the global bit line at a default voltage in response to a local pre-charge signal, and outputting the value stored in the memory cell to the global bit line when the local pre-charge signal is not asserted.

In another embodiment of the present invention, the read module comprises: at least one local I/O module coupled to a memory cell for outputting a value stored in the memory cell; a first NMOS transistor having a source coupled to ground, a drain coupled to a global bit line, and a gate coupled to the local I/O module; a first PMOS transistor having a drain coupled to the drain of the first NMOS transistor, and a gate controlled by a select signal; and a second PMOS transistor having a source coupled to a voltage supply, a drain coupled to a source of the first PMOS transistor, and a gate coupled to the gate of the first NMOS transistor and the I/O module, wherein the select signal is asserted to turn on the first PMOS transistor when the local I/O module is selected, wherein the first NMOS transistor is turned off and the second PMOS transistor is turned on to pre-charge the global bit line during pre-charge operation, wherein the first NMOS transistor and the second PMOS transistor are selectively turned on and off in response to a value stored in the memory cell during read operation.

The construction and method of operation of the invention, however, together with additional objectives and advantages thereof will be best understood from the following description of specific embodiments when read in connection with the accompanying drawings.

DESCRIPTION

This invention describes a single end read module with improved reliability against noise for register files. The following merely illustrates various embodiments of the present invention for purposes of explaining the principles thereof. It is understood that those skilled in the art will be able to devise various equivalents that, although not explicitly described herein, embody the principles of this invention.

Figure 1:
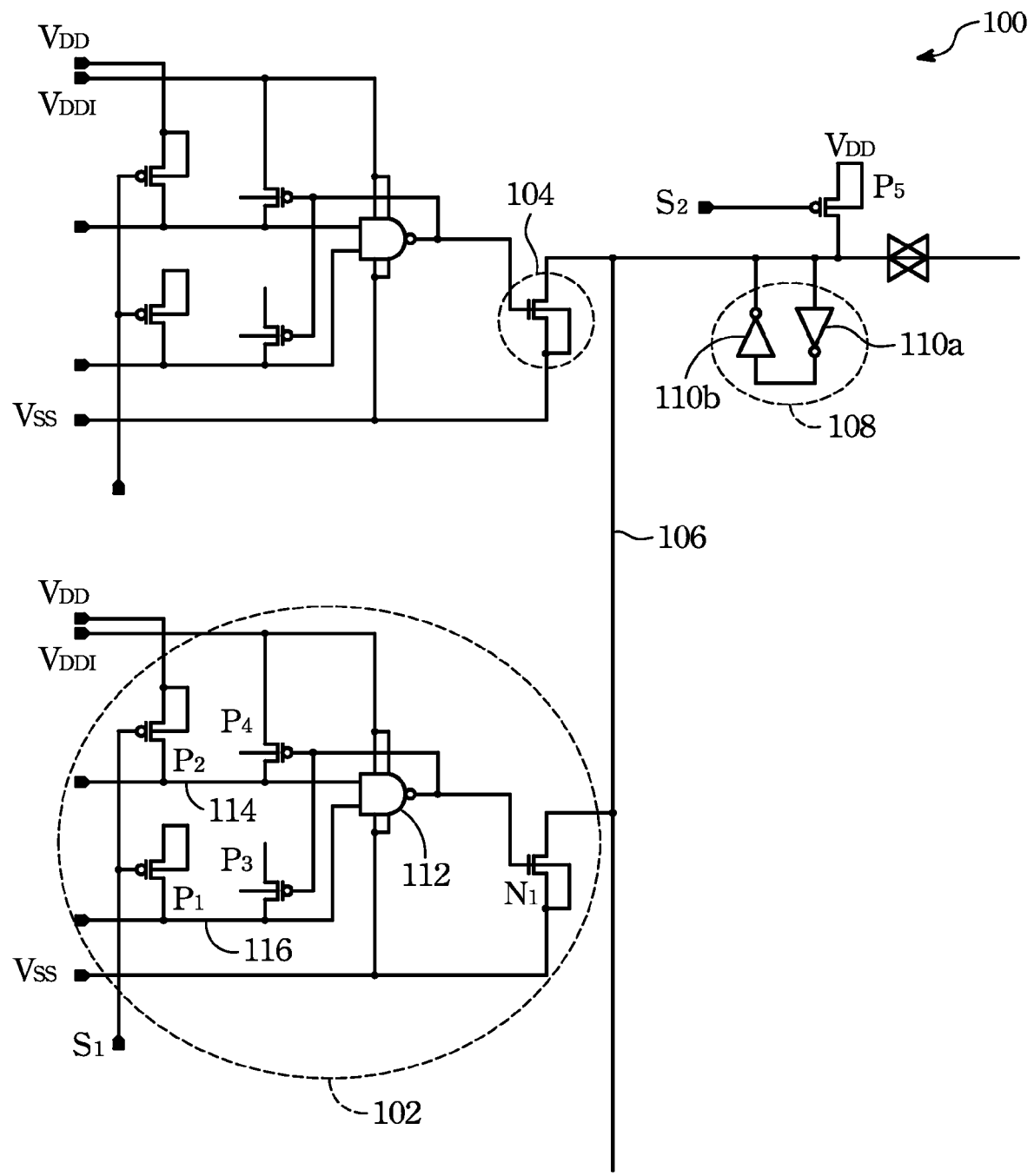
FIG. 1 schematically 1 illustrates a conventional single end read module for register files.
Figure 2:
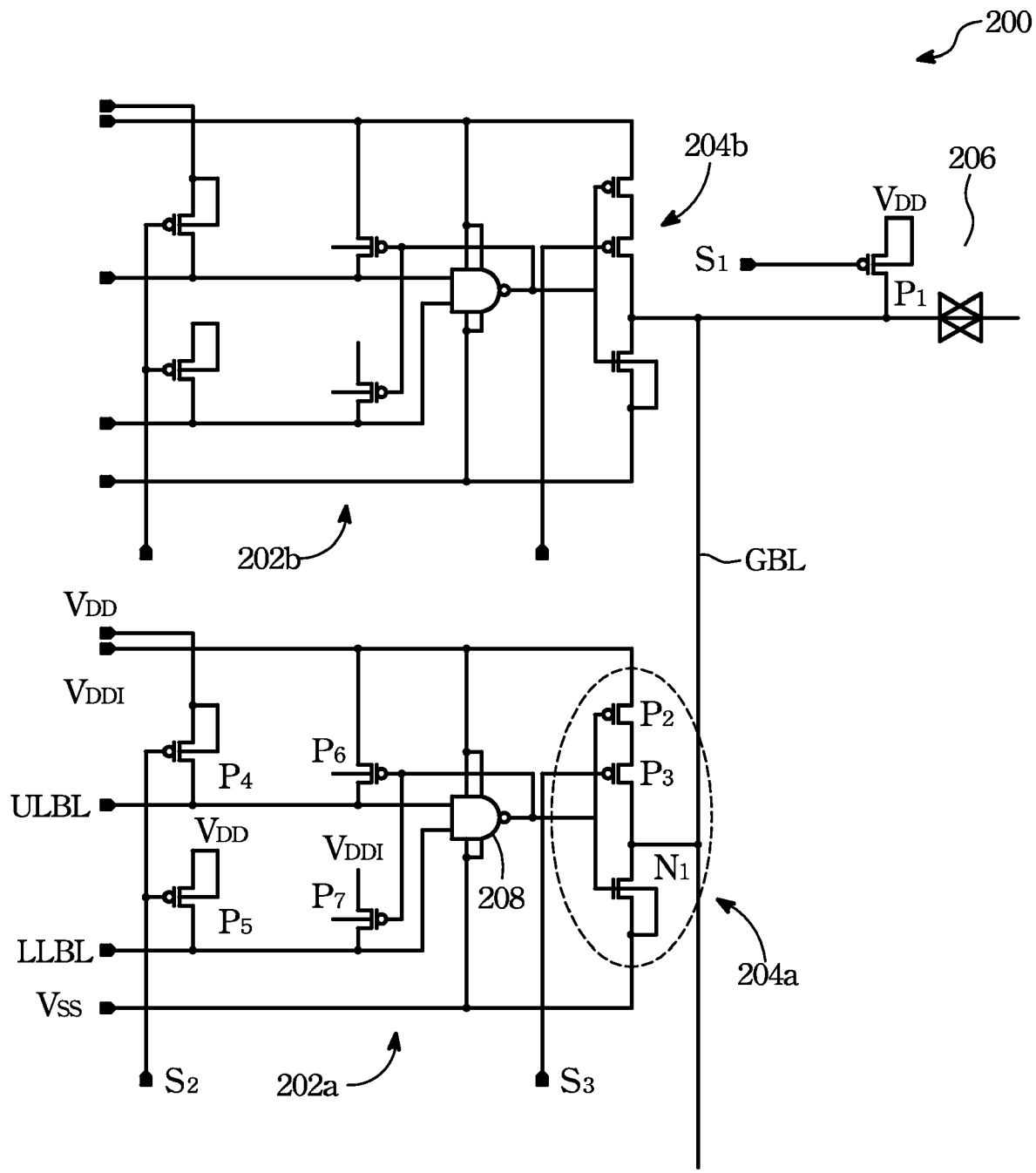
FIG. 2 schematically 1 illustrates a single end read module for register files in accordance with one embodiment of the present invention.

FIG. 2 schematically illustrates a single end read module 200 for enabling register files to be accessed from the outside for read operation in accordance with one embodiment of the present invention. The single end read module 200 is comprised of a number of local I/O modules such as 202a and 202b, each of which is connected to a column of registers or memory cells (not shown in the figure). The local I/O modules 202a and 202b are connected to a global bit line GBL, which is further connected to an I/O pin (not shown in this figure) for data outputs, through global bit line drivers 204a and 204b, respectively.

A pre-charge module 206, such as a PMOS transistor P1, is connected to the global bit line GBL. The PMOS transistor P1 has a source coupled to a voltage supply VDD, a drain coupled to the global bit line GBL, and a gate controlled by a global pre-charge signal S1. Although this embodiment of the present invention utilizes a PMOS transistor as the pre-charge module, other devices, such as NMOS transistors, bipolar transistors, or diodes, can also be employed as the pre-charge module based on various design considerations.

The I/O module 202a, for example, is comprised of PMOS transistors P4, P5, P6 and P7, and a NAND gate 208. The NAND gate 208 has two input terminals connected to a first local bit line ULBL and a second local bit line LLBL, and is coupled between an internal voltage supply VDDI and ground or VSS. The NAND gate 208 has an output terminal connected to the global bit line driver 204a, which will be explained in detail below.

The PMOS transistor P4 has a source coupled to the voltage supply VDD, a drain coupled to the first local bit line ULBL, and a gate controlled by a local pre-charge signal S2. The PMOS transistor P6 has a source coupled to the internal voltage supply VDDI, a drain coupled to the first local bit line ULBL, and a gate coupled to the output terminal of the NAND gate 208. The PMOS transistor P5 has a drain coupled to the voltage supply VDD, a source coupled to the second local bit line LLBL, and a gate controlled by the local pre-charge signal S2. The PMOS transistor P7 has a drain coupled to the internal voltage supply, a source coupled to the second local bit line LLBL, and a gate coupled to the gate of the PMOS transistor P6 and the output terminal of the NAND gate 208.

The global bit line driver 204a is comprised of PMOS transistors P2 and P3, and an NMOS transistor N1, serially coupled between the internal voltage supply and ground or VSS. The PMOS transistor P2 has a drain connected to the internal voltage supply VDDI, and a source connected to the drain of the PMOS transistor P3. The NMOS transistor N1 has a drain coupled to the drain of the PMOS transistor P3, and a source coupled to ground or VSS. The gates of the PMOS transistor P2 and the NMOS transistor N1 are connected together to function as an input terminal of the global bit line driver 204a. The drain of the PMOS transistor P3 and the drain of the NMOS transistor N1 are connected together to the global bit line GBL, to function as an output terminal of the global bit line driver 204a. The gate of the PMOS transistor P3 is controlled by a select signal S3.

In the global pre-charge stage, the global pre-charge signal S1 turns on the PMOS transistor P1, thereby raising the signal on the global bit line GBL to a high state. Once a particular I/O module 202a is selected for read operation, the select signal S3 is asserted to turn on the PMOS transistor P3, and the local pre-charge signal S2 is asserted to turn on PMOS transistors P4 and P5, thereby raising the signals on the local bit lines ULBL and LLBL to a high logic state. Since both input terminals of the NAND gate 208 receive high signals, the NAND gate 208 outputs a low signal, which, in turn, switches on the PMOS transistors P6 and P7. The low signal output from the NAND gate 208 turns off the NMOS transistor N1 and on the PMOS transistor P2, thereby raising the voltage on the global bit line GBL to a high state.

It is noted that in the embodiment of the present invention, the pre-charge module 206 is comprised of a PMOS transistor. However, other devices, such as NMOS transistors or bipolar devices can also be used to function as a pre-charge switch, depending on design considerations.

In read operation, the global and local pre-charge signals S1 and S2 are disabled to turn off the PMOS transistors P1, P4 and P5, thereby allowing the signals on the global bit line GBL to freely respond to the value stored in the register or memory cell (not shown in the figure) coupled to the I/O module 202 though the local bit lines ULBL and LLBL. If the voltage on either one of the local bit lines ULBL and LLBL is low, the NAND gate 208 outputs a high signal, which, in turn, switches off the PMOS transistors P2, P6 and P7, and on the NMOS transistor N1. As the source of the NMOS transistor N1 is coupled to ground or VSS, the voltage on the global bit line is pulled down in response to the voltages on the local bit lines ULBL and LLBL. If the voltage on both the local bit lines ULBL and LLBL are high, the NAND gate 208 outputs a low signal, which turns on the PMOS transistor P2 and off the NMOS transistor N1, such that the voltage on the global bit line GBL remains high. Thus, the proposed single end read module 202 for register files is able to provide the global bit line GBL with a high voltage as a default state, and produce read signals on the global bit line GBL in response to the inputs on the local bit lines ULBL and LLBL.

The proposed single end read module in accordance with one embodiment of the present invention improves the reliability of read operation compared to the conventional single end read module. By virtue of implementing a CMOS device in the global bit line driver, the embodiment of the present invention eliminates the need of a latch for latching the default state of the signal on the global bit line. Because the conventional global bit line latch is particularly susceptible to noise-induced reliability issues, the proposed single end read module without the conventional global bit line latch is able to improve its reliability against noise. Such single end read module is particular suitable for low voltage supply and high noise circuitry environment. For example, this proposed single end read module is particularly suitable for complier-type register file designs. In addition, the proposed single end read module imposes no layout area penalty as opposed to the conventional design. As such, the proposed design is able to achieve higher reliability without compromising on layout areas.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A read module for register files, comprising:
   at least one local I/O module coupled to a memory cell for outputting a value stored in the memory cell; and
   at least one global bit line driver having an input terminal coupled to the local I/O module, and an output terminal coupled to a global bit line for selectively pre-charging the global bit line at a default voltage in response to a local pre-charge signal, and outputting the value stored in the memory cell to the global bit line when the local pre-charge signal is not asserted, wherein the global bit line driver comprises:
a first NMOS transistor having a source coupled to ground, a drain coupled to the global bit line, and a gate coupled to the local I/O module; and
a first PMOS transistor having a drain coupled to the drain of the first NMOS transistor, and a gate controlled by a select signal.

2. The read module for register files of claim 1 wherein the select signal is at a low level to turn on the first PMOS transistor when the local I/O module is selected for read operation.

3. The read module for register files of claim 2 wherein the global bit line driver comprises a second PMOS transistor having a source coupled to a voltage supply, a drain coupled to a source of the first PMOS transistor, and a gate coupled to the gate of the first NMOS transistor.

4. The read module for register files of claim 3 wherein the I/O module comprises an NAND gate having an output terminal coupled to the gate of the second PMOS transistor and the gate of the first NMOS transistor.

5. The read module for register files of claim 4 wherein the NAND gate comprises a first input terminal coupled to a first local bit line, and a second input terminal coupled to a second local bit line.

6. The read module for register files of claim 5 wherein the I/O module comprises a third PMOS transistor having a source coupled to a voltage supply, a drain coupled to the first local bit line, and a gate controlled by the local pre-charge signal.

7. The read module for register files of claim 6 wherein the I/O module comprises a fourth PMOS transistor having a source coupled to a voltage supply, a drain coupled to the second local bit line, and a gate controlled by the local pre-charge signal.

8. The read module for register files of claim 7 wherein the local pre-charge signal is at a low level to turn on the third and fourth PMOS transistors to provide the first and second input terminals of the NAND gate with signals at a high level.

9. The read module for register files of claim 8 wherein the local I/O module comprises a fifth PMOS transistor having a source coupled to the voltage supply, a drain coupled to the first local bit line, and a gate coupled to the output terminal of the NAND gate.

10. The read module for register files of claim 9 wherein the local I/O module comprises a sixth PMOS transistor having a source coupled to the voltage supply, a drain coupled to the second local but line, and a gate coupled to the gate of the fifth PMOS transistor.

11. The read module for register files of claim 1 comprising a seventh PMOS transistor having a source coupled to the voltage supply, a drain coupled to the global bit line, and a gate controlled by a global pre-charge control signal.

12. The read module of claim 11 wherein the global pre-charge signal is at a low level to turn on the seventh PMOS transistor during a pre-charge stage.

13. A read module for register files, comprising:
at least one local I/O module coupled to a memory cell for outputting a value stored in the memory cell;
a first NMOS transistor having a source coupled to ground, a drain coupled to a global bit line, and a gate coupled to the local I/O module;
a first PMOS transistor having a drain coupled to the drain of the first NMOS transistor, and a gate controlled by a select signal; and
a second PMOS transistor having a source coupled to a voltage supply, a drain coupled to a source of the first PMOS transistor, and a gate coupled to the gate of the first NMOS transistor and the I/O module,
wherein the select signal is asserted to turn on the first PMOS transistor when the local I/O module is selected,
wherein the first NMOS transistor is turned off and the second PMOS transistor is turned on to pre-charge the global bit line during pre-charge operation,
wherein the first NMOS transistor and the second PMOS transistor are selectively turned on and off in response to a value stored in the memory cell during read operation.

14. The read module for register files of claim 13 wherein the local I/O module comprises an NAND gate having an output terminal coupled to the gate of the second PMOS transistor and the gate of the first NMOS transistor.

15. The read module for register files of claim 14 wherein the NAND gate comprises a first input terminal coupled to a first local bit line, and a second input terminal coupled to a second local bit line.

16. The read module for register files of claim 15 wherein the local I/O module comprises a third PMOS transistor having a source coupled to a voltage supply, a drain coupled to the first local bit line, and a gate controlled by a local pre-charge signal.

17. The read module for register files of claiml 16 wherein the local I/O module comprises a fourth PMOS transistor having a source coupled to a voltage supply, a drain coupled to the second local bit line, and a gate controlled by the local pre-charge signal.

18. The read module for register files of claim 17 wherein the local pre-charge signal is at a low level to turn on the third and fourth PMOS transistors to provide the first and second input terminals of the NAND gate with signals at a high level.

* * * * *